United States Patent
Li (10) Patent No.: US 9,898,959 B2
(45) Date of Patent: Feb. 20, 2018

(54) CONTROL SUB-UNIT, SHIFT REGISTER UNIT, SHIFT REGISTER, GATE DRIVING CIRCUIT AND DISPLAY DEVICE

(71) Applicant: BOE Technology Group Co., Ltd., Beijing (CN)

(72) Inventor: Quanhu Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 169 days.

(21) Appl. No.: 14/914,576

(22) PCT Filed: Aug. 21, 2015

(86) PCT No.: PCT/CN2015/087761
§ 371 (c)(1),
(2) Date: Feb. 25, 2016

(87) PCT Pub. No.: WO2016/155211
PCT Pub. Date: Oct. 6, 2016

(65) Prior Publication Data
US 2017/0039930 A1    Feb. 9, 2017

(30) Foreign Application Priority Data
Mar. 31, 2015    (CN) .......................... 2015 1 0148924

(51) Int. Cl.
*G11C 19/00*    (2006.01)
*G09G 3/20*    (2006.01)
(Continued)

(52) U.S. Cl.
CPC ............. *G09G 3/2092* (2013.01); *G09G 3/20* (2013.01); *G09G 3/3266* (2013.01);
(Continued)

(58) Field of Classification Search
None
See application file for complete search history.

(56) References Cited

U.S. PATENT DOCUMENTS 8,970,467 B2 * 3/2015 Chan .................... G09G 3/3677
345/100
2009/0041177 A1    2/2009 Chien et al.
(Continued)

FOREIGN PATENT DOCUMENTS

CN    103680442 A    3/2014
CN    103680443 A    3/2014
(Continued)

OTHER PUBLICATIONS

Dec. 10, 2015—(WO)—International Search Report and Written Opinion Appn PCT/CN2015/087761 with English Tran.
(Continued)

*Primary Examiner* — Taun T Lam
(74) *Attorney, Agent, or Firm* — Banner & Witcoff, Ltd.

(57) ABSTRACT

A control sub-unit, a shift register unit, a shift register, a gate driving circuit and a display apparatus. The control sub-unit comprises a low level input terminal (VGL), a selection module and N sets of nodes (Q1', QB1', Q2', QB2' ... QN', QBN'), each set of nodes (Q1', QB1', Q2', QB2' ... QN', QBN') comprises a first control node (Q1', Q2', ... QN') and a second control node (QB1', QB2' ... QBN'), when the first control node (Q1') in one set of nodes (Q1', QB1') among the N sets of nodes is at a high level and the second control node (QB1') in said one set of nodes (Q1', QB1') is at a low level, the selection module connects the second control nodes (QB2' ... QBN') of the other N−1 sets of nodes (Q2', QB2' ... QN', QBN') to the low level input terminal, such that the first control nodes (Q2', ... QN') and the second control nodes (QB2' ... QBN') in the other N−1 sets of nodes (Q2', (Continued)

QB2' ... QN', QBN') are all at the low level, wherein N is a positive integer larger than 1.

11 Claims, 4 Drawing Sheets

(51) Int. Cl.
*G09G 3/3266* (2016.01)
*G09G 3/36* (2006.01)
*G11C 19/28* (2006.01)

(52) U.S. Cl.
CPC ............ *G09G 3/3677* (2013.01); *G11C 19/28* (2013.01); *G09G 2300/0809* (2013.01); *G09G 2310/0286* (2013.01)

(56) References Cited

U.S. PATENT DOCUMENTS

| | | | | |
|---|---|---|---|---|
| 2014/0062847 | A1* | 3/2014 | Chien | G09G 3/3677 345/100 |
| 2014/0091997 | A1* | 4/2014 | Han | G09G 3/3677 345/92 |
| 2016/0180964 | A1* | 6/2016 | Hu | G11C 19/28 345/100 |
| 2016/0351148 | A1* | 12/2016 | Xu | G11C 19/00 |

FOREIGN PATENT DOCUMENTS

| | | |
|---|---|---|
| CN | 104299594 A | 1/2015 |
| CN | 104700766 A | 6/2015 |

OTHER PUBLICATIONS

Nov. 28, 2016—(CN) First Office Action Appn 201510148924.0 with English Tran.

* cited by examiner

CONTROL SUB-UNIT, SHIFT REGISTER UNIT, SHIFT REGISTER, GATE DRIVING CIRCUIT AND DISPLAY DEVICE

The application is a U.S. National Phase Entry of International Application No. PCT/CN2015/087761 filed on Aug. 21, 2015, designating the United States of America and claiming priority to Chinese Patent Application 201510148924.0, filed on Mar. 31, 2015. The present application claims priority to and the benefit of the above-identified applications and the above-identified applications are incorporated by reference herein in their entirety.

TECHNICAL FIELD

The present disclosure relates to a control sub-unit, a shift register unit, a shift register, a gate driving circuit and a display device.

BACKGROUND

Organic light emitting diodes OLEDs have been increasingly applied in a high performance display field as a current-type light-emitting device due to its characteristics of self-luminance, rapid response, wide view angle, possibility of being produced on a flexible substrate and so on. OLED display devices can be divided into passive matrix driving OLED PMOLED and active matrix driving OLED AMOLED according to their different driving manners. It can be expected that the AMOLEDs will replace liquid crystal displays as a next generation of new flat-panel display due to its advantages of low manufacturing cost, high response rapid, power saving, possibility of being applied into DC driving of portable devices, wide range of operational temperature and so on. Therefore, AMOLED display panels have attracted a lot of attentions.

Generally, an AMOLED panel is driven by gate driving signals having a plurality of pulses. In addition, in a LCD panel, in order to ensure fully charging, gate driving signals having a plurality of pulses are also required for driving. However, it is impossible to generate a gate driving signal having a plurality of pulses by a single shift register currently.

SUMMARY

In at least one embodiment of the present disclosure, there are provided a control sub-unit, a shift register unit comprising the control sub-unit, a shift register comprising the shift register unit, a gate driving circuit comprising the shift register and a display device comprising the gate driving circuit, the shift register unit is capable of outputting a plurality of pulse signals.

According to one aspect of the present disclosure, there is provided a control sub-unit comprising a low level input terminal, a selection module and N sets of nodes, each set of nodes comprises a first control node and a second control node, when the first control node in one set of nodes among the N sets of nodes is at a high level and the second control node in said one set of nodes is at a low level, the selection module connects the second control nodes of the other N−1 sets of nodes to the low level input terminal, such that the first control nodes and the second control nodes in the other N−1 sets of nodes are all at the low level, wherein N is a positive integer larger than 1.

Optionally, N is 2.

Optionally, the selection module comprises: a first thin film transistor having a gate connected to the first control node in said one set of nodes, a first electrode connected to the first control node in the other set of nodes, and a second electrode connected to the low level input terminal; a second thin film transistor having a gate connected to the first control node in the other set of nodes, a first electrode connected to the first control node in said one set of nodes, and a second electrode connected to the low level input terminal; a third thin film transistor having a gate connected to the first control node in said one set of nodes, a first electrode connected to the low level input terminal, and a second electrode connected to the second control node in the other set of nodes; and a fourth thin film transistor having a gate connected to the first control node in the other set of nodes, a first electrode connected to the low level input terminal, and a second electrode connected to the second control node in said one set of nodes.

Optionally, each set of nodes further comprises a first feedback node, and the selection module further comprises: a first feedback suppression thin film transistor having a gate connected to the first control node in said one set of nodes, a first electrode connected to the first control node in the other set of nodes, and a second electrode connected to the first feedback node in the other set of nodes; and a second feedback suppression thin film transistor having a gate connected to the first control node in the other set of nodes, a first electrode connected to the first control node in said one set of nodes, and a second electrode connected to the first feedback node in said one set of nodes, wherein the first electrode of the first thin film transistor is connected to the first feedback node in the other set of nodes rather than the first control node in the other set of nodes, and the first electrode of the second thin film transistor is connected to the first feedback node in said one set of nodes rather than the first control node in said one set of nodes.

According to another aspect of the present disclosure, there is provided a shift register unit having a main output terminal and comprising a control sub-unit and N shift register sub-units, said N shift register sub-units are capable of outputting signals with predefined waveforms during different time periods, the control sub-unit is the above control sub-unit provided in the present disclosure, said N set of nodes of the control sub-unit are corresponding to said N shift register sub-units one by one. For any one set of nodes, the first control node of said one set of nodes is connected to a pull-up node of the shift register sub-unit corresponding to said one set of nodes, the second control node of said one set of nodes is connected to a pull-down node of the shift register sub-unit corresponding to said one set of nodes, such that, during an output phase of any one of said N shift register sub-units, the control sub-unit connects the pull-down nodes of other shift register sub-units to the low level input terminal so as to make said other shift register sub-units output a high impedance state.

Optionally, each of said shift register sub-units comprises a transfer module, an output module and a transfer output terminal. The transfer module comprises a transfer pull-up transistor and a transfer pull-down transistor, the transfer pull-up transistor has a gate connected to the pull-up node, a first electrode connected to a clock signal input terminal and a second electrode connected to a first electrode of the transfer pull-down transistor, the transfer pull-down transistor has a gate connected to the pull-down node and a second electrode connected to the low level input terminal, and the transfer output terminal is connected between the second electrode of the transfer pull-up transistor and the first electrode of the transfer pull-down transistor. The output module comprises an output pull-up transistor and an output pull-down transistor, the output pull-up transistor has a gate connected to the pull-up node, a first electrode connected to the clock signal input terminal, and a second electrode connected to a first electrode of the output pull-down transistor, the output pull-down transistor has a gate connected to the pull-down node and a second electrode connected to the low level input terminal, and the main output terminal is connected between the second electrode of the output pull-up transistor and the first electrode of the output pull-down transistor.

Optionally, in the control sub-unit, each set of nodes comprises a first feedback node, and the selection module further comprises: a first feedback suppression thin film transistor having a gate connected to the first control node in said one set of nodes, a first electrode connected to the first control node in the other set of nodes, and a second electrode connected to the first feedback node in the other set of nodes; and a second feedback suppression thin film transistor having a gate connected to the first control node in the other set of nodes, a first electrode connected to the first control node in said one set of nodes, and a second electrode connected to the first feedback node in said one set of nodes, wherein the first electrode of the first thin film transistor is connected to the first feedback node in the other set of nodes rather than the first control node in the other set of nodes, and the first electrode of the second thin film transistor is connected to the first feedback node in said one set of nodes rather than the first control node in said one set of nodes. Each of said shift register sub-units comprises a second feedback node. The first feedback node is connected to the second feedback node of the shift register sub-unit corresponding thereto. Wherein, when the pull-up node of one stage of two stages of shift register sub-units is at a high level, the second feedback node of said one stage of shift register sub-unit is also at a high level; when the pull-up node of the other stage of two stages of shift register sub-units is at a high level, the second feedback node of the other stage of shift register sub-unit is also at a high level.

Optionally, each of said shift register sub-units comprises a feedback module, the feedback module comprises a feedback pull-up transistor, a feedback pull-down transistor and a feedback output transistor, the feedback pull-up transistor has a gate connected to the pull-up node, a first electrode connected to a clock signal input terminal, and a second electrode connected to a first electrode of the feedback pull-down transistor, the transfer pull-down transistor has a gate connected to the pull-down node and a second electrode connected to the low level input terminal, the feedback output transistor has a gate connected to the transfer output terminal, a first electrode connected to the second feedback node and a second electrode connected between the second electrode of the feedback pull-up transistor and the first electrode of the feedback pull-down transistor.

According to another aspect of the present disclosure, there is provided a shift register comprising a plurality of shift register units connected in cascade, wherein the shift register unit is the above shift register unit as provided in the present disclosure, in two adjacent stages of shift register units, the plurality of shift register sub-units in a first stage of the two adjacent stages of shift register units are connected in cascade with the plurality of shift register sub-units in a second stage of the two adjacent stages of shift register units in one-to-one correspondence.

According to another aspect of the present disclosure, there is further provided a gate driving circuit comprising the above shift register as provided in the present disclosure.

According to another aspect of the present disclosure, there is further provided a display apparatus comprising the above gate driving circuit as provided in the present disclosure.

In the shift register unit as provided in the present disclosure, the control sub-unit is added to merge a plurality of signals, such that it can be achieved that one shift register unit outputs a plurality of signals.

DETAILED DESCRIPTION

Hereinafter, specific implementations of the present disclosure would be described in detail in connection with the accompanying drawings. It should be understood that the specific implementations described herein are only used for illustration and explanation of the present disclosure, but not intended to make any limitation to the present disclosure.

Figure 1:
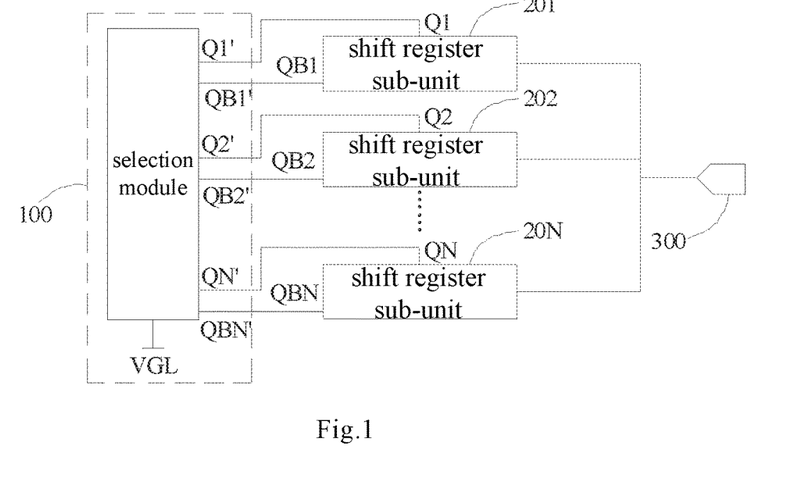
FIG. 1 is a schematic modular diagram of a shift register unit comprising a control sub-unit provided in embodiments of the present disclosure.

FIG. 1 is a schematic modular diagram of a shift register unit provided in embodiments of the present disclosure, the shift register unit comprises a control sub-unit 100 provided in the embodiments of the present disclosure. The control sub-unit 100 comprises a low level input terminal VGL, a selection module and N sets of nodes. Each set of nodes comprises a first control node and a second control node, the selection module is configured to, when the first control node in one set of nodes among the N sets of nodes is at a high level and the second control node in said one set of nodes is at a low level, connect the second control nodes of the other N−1 sets of nodes to the low level input terminal, such that the first control nodes and the second control nodes in the other N−1 sets of nodes are all at the low level, wherein N is a positive integer larger than 1.

In the implementation as shown in FIG. 1, a first set of nodes of the control sub-unit 100 comprises the first control node Q1' and the second control node QB1'; a second set of nodes of the control sub-unit 100 comprises the first control node Q2' and the second control node QB2'; and so on, a $N^{th}$ set of node of the control sub-unit 100 comprises the first control node QN' and the second control node QBN'.

As shown in FIG. 1, the control sub-unit 100 provided in the embodiments of the present disclosure can be applied in the shift register unit. The shift register unit comprises N shift register sub-units each of which comprises a pull-up node and a pull-down node. Each of the shift register sub-units is corresponding to a set of node in the control sub-unit 100.

For any one set of nodes, the first control node of said one set of nodes is connected to a pull-up node of the shift register sub-unit corresponding to said one set of nodes, the second control node of said one set of nodes is connected to a pull-down node of the shift register sub-unit corresponding to said one set of nodes.

Since one shift register unit comprises N shift register sub-units, when any one of said N shift register sub-units is in an output phase, the selection module connects the second control nodes of N−1 sets of nodes other than the set of nodes corresponding to the shift register sub-unit in the output phase to the low level input terminal VGL, such that the first control nodes and the second control nodes of the other N−1 sets of nodes are at a low level. For any one set of nodes, a level at the first control node is same as a level at the pull-up node of its corresponding shift register sub-unit, and a level at the second control node is same as a level at the pull-down node of its corresponding shift register sub-unit. Therefore, except the shift register sub-unit in the output phase, the pull-up nodes and the pull-down nodes of the other N−1 shift register sub-units are all at a low level, such that it can be achieved that the output terminals of the other N−1 shift register sub-units can output a high impedance state.

Therefore, with the control sub-unit provided in the embodiments of the present disclosure, it can be achieved that the shift register sub-unit outputs the high impedance state, and then it can be achieved that a scan signal with different waveforms can be outputted on a single gate line.

Beside application into the shift register unit, the control sub-unit provided in the embodiments of the present disclosure can also be applied in other circuit configuration.

In the embodiments of the present disclosure, specific value of N is not defined, and N is an integer larger than 1.

Of course, value of N is determined according to where the control sub-unit 100 is particularly applied. For example, when the control sub-unit 100 is used in the shift register unit, the value of N can be determined according to the number of the shift register sub-unit. When the shift register unit having the control sub-unit 100 comprises two stages of shift register sub-units, N is 2.

As shown in FIG. 1, as another aspect of the embodiments of the present disclosure, there is provided a shift register unit, wherein the shift register unit has a main output terminal 300, the shift register unit comprises a control sub-unit 100 and N shift register sub-units (the shift register sub-unit 201, the shift register sub-unit 202 the shift register sub-unit 20N as shown in FIG. 1), said N shift register sub-units are capable of outputting signals with predefined waveforms during different time periods, the control sub-unit 100 is the above control sub-unit provided in the present disclosure, said N set of nodes of the control sub-unit are corresponding to said N shift register sub-units one by one. For any one set of nodes, the first control node of said one set of nodes is connected to a pull-up node of the shift register sub-unit corresponding to said one set of nodes, the second control node of said one set of nodes is connected to a pull-down node of the shift register sub-unit corresponding to said one set of nodes, such that, during an output phase of any one of said N shift register sub-units, the control sub-unit connects the pull-down nodes of other shift register sub-units to the low level input terminal so as to make said other shift register sub-units output a high impedance state.

In FIG. 1, the pull-up node Q1 of the shift register sub-unit 201 is connected to the first control node Q1' of the first set of nodes in the control sub-unit 100, the pull-down node QB1 of the shift register sub-unit 201 is connected to the second control node QB1' of the first set of nodes; the pull-up node Q2 of the shift register sub-unit 202 is connected to the first control node Q2' of the second set of nodes in the control sub-unit 100, the pull-down node QB2 of the shift register sub-unit 202 is connected to the second control node QB2' of the second set of nodes in the control sub-unit 100; the pull-up node QN of the shift register sub-unit 20N is connected to the first control node QN' of the $N^{th}$ set of nodes in the control sub-unit 100, the pull-down node QBN of the shift register sub-unit 20N is connected to the second control node QBN' of the $N^{th}$ set of nodes in the control sub-unit 100.

A shift register sub-unit in the embodiments of the present disclosure is equivalent to a typical shift register unit, the output state of the shift register sub-unit in the embodiments of the present disclosure is controlled by levels at the pull-up node and at the pull-down node thereof. When the pull-up node and the pull-down node of the shift register sub-unit are both at a low level, the output terminal of the shift register unit is in a floating state for a load, the transistor shows a huge off-state resistance between the high or low level signal inside the shift register and the output terminal of the shift register, therefore the shift register sub-unit cannot output any signal, which is equivalent to outputting a high impedance state.

Figure 2:
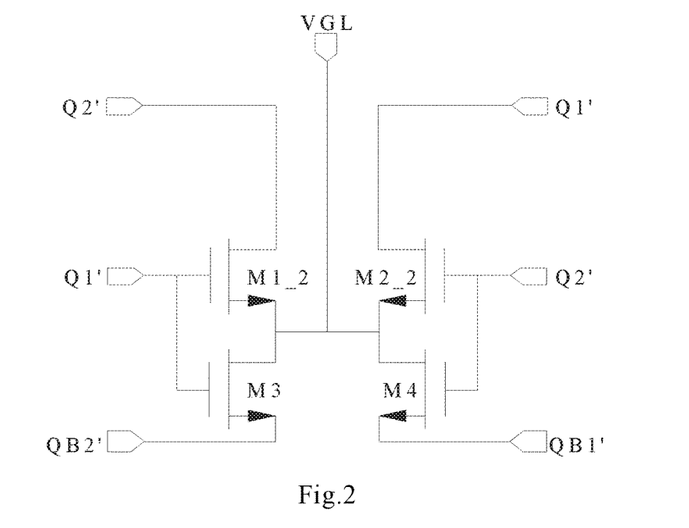
FIG. 2 is a schematic diagram of a first implementation of the control sub-unit provided in the embodiments of the present disclosure.
Figure 3:
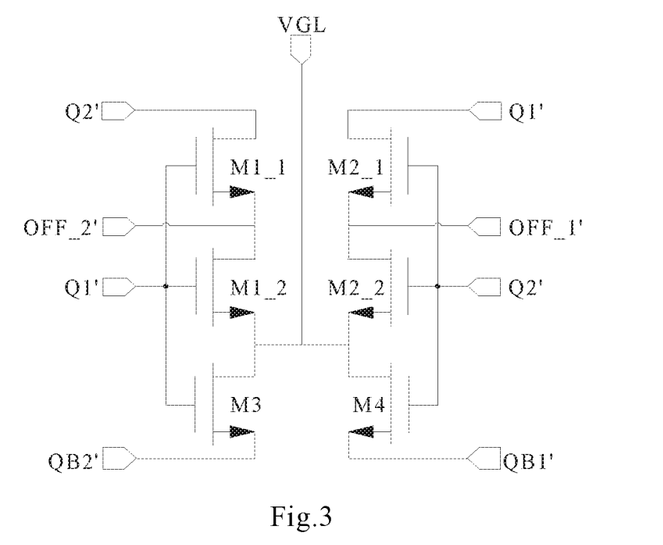
FIG. 3 is a schematic diagram of a second implementation of the control sub-unit provided in the embodiments of the present disclosure.

Two specific implementations of the control sub-unit are shown in FIG. 2 and FIG. 3. As shown in FIG. 2, the control sub-unit has two sets of nodes, one set of nodes comprises the first control node Q1' and the second control node QB1'; the other set of nodes comprises the first control node Q2' and the second control node QB2'.

The selection module comprises: a first thin film transistor M1_2 having a gate connected to the first control node Q1' in said one set of nodes, a first electrode connected to the first control node Q2' in the other set of nodes, and a second electrode connected to the low level input terminal VGL; a second thin film transistor M2_2 having a gate connected to the first control node Q2' in the other set of nodes, a first electrode connected to the first control node Q1' in said one set of nodes, and a second electrode connected to the low level input terminal VGL; a third thin film transistor M3 having a gate connected to the first control node Q1' in said one set of nodes, a first electrode connected to the low level input terminal VGL, and a second electrode connected to the second control node QB2' in the other set of nodes; and a fourth thin film transistor M4 having a gate connected to the first control node Q2' in the other set of nodes, a first electrode connected to the low level input terminal VGL, and a second electrode connected to the second control node QB1' in said one set of nodes.

Hereinafter, the operational principle of the control sub-unit as shown in FIG. 2 will be explained with reference to specific application of the control sub-unit, and detailed explanations are not given here.

As shown in FIG. 3, each set of nodes comprises a first feedback node, and the selection module further comprises: a first feedback suppression thin film transistor M1_1 having a gate connected to the first control node Q1' in said one set of nodes, a first electrode connected to the first control node Q2' in the other set of nodes and a second electrode connected to the first feedback node OFF_2' in the other set of nodes; and a second feedback suppression thin film transistor M2_1 having a gate connected to the first control node Q2' in the other set of nodes, a first electrode connected to the first control node Q1' in said one set of nodes, and a second electrode connected to the first feedback node OFF_1' in said one set of nodes.

As shown in FIG. 3, in case that the selection module comprises the first feedback suppression thin film transistor M1_1 and the second feedback suppression thin film transistor M2_1, wherein the first electrode of the first thin film transistor M1_2 is connected to the first feedback node OFF_2' in the other set of nodes rather than the first control node Q2' in the other set of nodes, and the first electrode of the second thin film transistor M2_2 is connected to the first feedback node OFF_1' in said one set of nodes rather than the first control node Q1' in said one set of nodes.

Hereinafter, advantages of the first feedback suppression thin film transistor and the second feedback suppression thin film transistor will be described with reference to specific implementations, detailed description is not given here.

Further explanations will be given to the shift register unit provided in the embodiments of the present disclosure with reference to FIG. 4.

Figure 4:
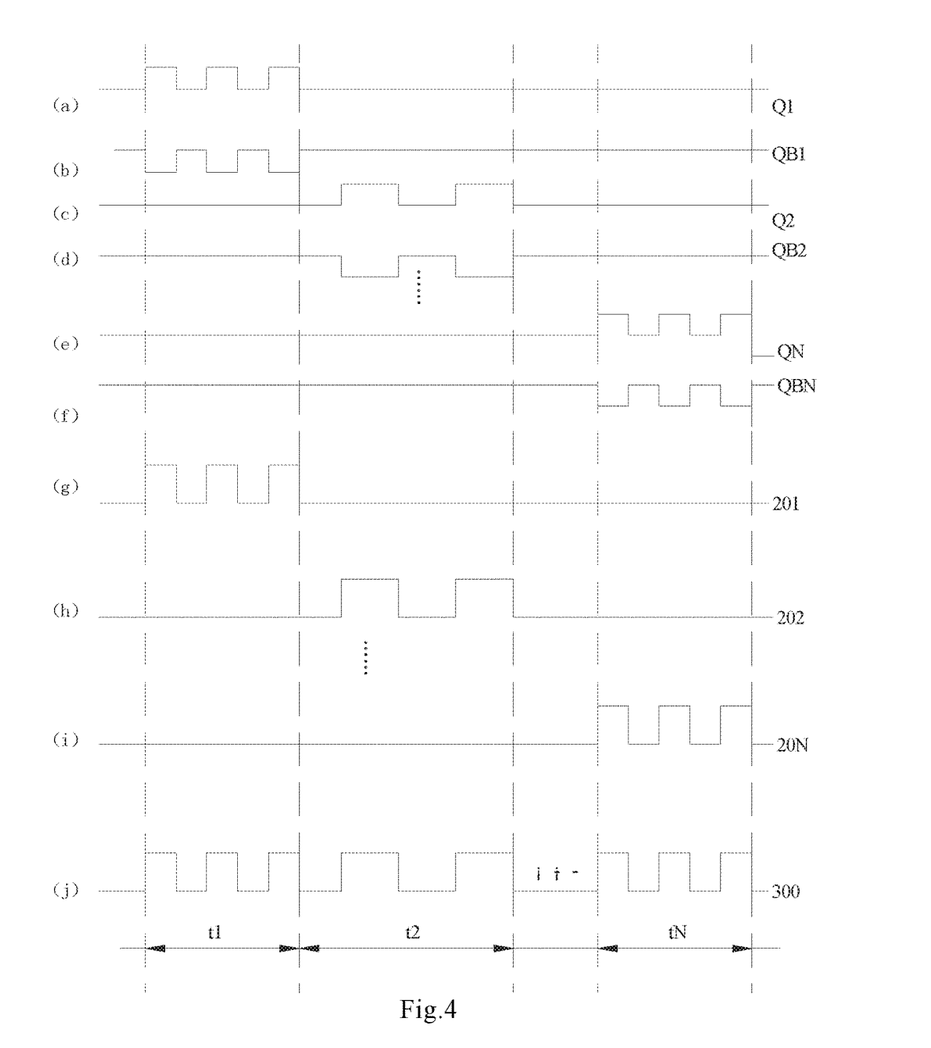
FIG. 4 shows schematic diagram of timing sequence of signals at pull-up nodes and pull-down nodes of individual shift register sub-units 201, 202 and 20N, schematic diagram of timing sequence of output signals of the individual shift register sub-units 201, 202 and 20N, and schematic diagram of timing sequence of an output signal of the shift register unit provided in the embodiments of the present disclosure, respectively.

In case that the output terminals of the shift register sub-units 201, 202 . . . 20N are not connected to the main output terminal 300 and the control sub-unit 100 is not set, during t1 time period, the shift register sub-unit 201 outputs a first set of pulse signals (as shown in the signal line (g) in FIG. 4), and all of the other shift register sub-units output a low level signal; during t2 time period, the shift register sub-unit 202 outputs a second set of pulse signals (as shown in the signal line (h) in FIG. 4), and all of the other shift register sub-units output a low level signal; . . . ; during tN time period, the shift register sub-unit 20N outputs a $N^{th}$ set of pulse signals (as shown in the signal line (i) in FIG. 4), and all of the other shift register sub-units output a low level signal.

In case that the shift register sub-unit 201 is used individually (that is, the output terminal of the shift register sub-unit 201 is not connected to the output terminals of the other shift register sub-units), in order to output the waveform as shown in the signal line (g) in FIG. 4 during t1 time period, a level at the pull-up node Q1 thereof is as shown in the signal line (a) in FIG. 4, and a level at the pull-down node QB1 thereof is as shown in the signal line (b) in FIG. 4. It can be seen that the shift register sub-unit 201 outputs a high level when the pull-up node Q1 is at a high level, and outputs a low level when the pull-down node QB1 is at a high level.

In case that the shift register sub-unit 202 is used individually (that is, the output terminal of the shift register sub-unit 202 is not connected to the output terminals of the other shift register sub-units), in order to output the waveform shown in the signal line (h) in FIG. 4 during t2 time period, a level at the pull-up node Q2 thereof is as shown in the signal line (c) in FIG. 4, and a level at the pull-down node QB2 thereof is as shown in the signal line (d) in FIG. 4. It can be seen that the shift register sub-unit 202 outputs a high level when the pull-up node Q2 is at a high level, and outputs a low level when the pull-down node QB2 is at a high level.

In case that the shift register sub-unit 20N is used individually (that is, the output terminal of the shift register sub-unit 20N is not connected to the output terminals of the other shift register sub-units), in order to output the waveform shown in the signal line (i) in FIG. 4 during tN time period, a level at the pull-up node QN thereof is as shown in the signal line (e) in FIG. 4, and a level at the pull-down node QBN thereof is as shown in the signal line (f) in FIG. 4. It can be seen that the shift register sub-unit 20N outputs a high level when the pull-up node QN is at a high level, and outputs a low level when the pull-down node QBN is at a high level.

After the output terminals of the N shift register sub-units 201, 202 . . . 20N are not connected to the main output terminal 300, since the output terminals of the shift register sub-units 201, 202 . . . 20N are connected to the main output terminal 300 and the control sub-unit 100 is set, during t1 time period, the control sub-unit 100 controls that the pull-up nodes and the pull-down nodes of the shift register sub-units 202 . . . 20N at a low level, such that all of the shift register sub-units 202 . . . 20N output a high impedance state. Therefore, during t1 time period, only the first pulse signal outputted from the shift register sub-unit 201 is outputted to the main output terminal 300, and then to a gate line connected to the main output terminal via the main output terminal 300.

Accordingly, during t2 time period, the control sub-unit 100 controls that the pull-up nodes and the pull-down nodes of all the shift register sub-units other than the shift register sub-unit 202 at a low level, such that all the shift register sub-units other than the shift register sub-unit 202 output a high impedance state. Therefore, during t2 time period, only the second pulse signal outputted from the shift register sub-unit 202 is outputted to the main output terminal 300, and then to a gate line connected to the main output terminal via the main output terminal 300.

Accordingly, during tN time period, the control sub-unit 100 controls that the pull-up nodes and the pull-down nodes of all the shift register sub-units other than the shift register sub-unit 20N at a low level, such that all the shift register sub-units other than the shift register sub-unit 20N output a high impedance state. Therefore, during tN time period, only the $N^{th}$ pulse signal outputted from the shift register sub-unit 20N is outputted to the main output terminal 300, and then to a gate line connected to the main output terminal via the main output terminal 300.

At last, the waveform of the signal outputted from the main output terminal 300 is as shown in the signal line (j) in FIG. 4.

In the shift register unit provided in the embodiments of the present disclosure, the control sub-unit is added to merge a plurality of signals, and there is no need for setting additional leading wires for signal lines, therefore design of a narrow bezel of a display panel can be achieved by adopting the shift register unit as provided in the embodiments of the present disclosure.

In the embodiments of the present disclosure, no specific limitation is made on the number of the shift register sub-units. As a specific implementation of the embodiments of the present disclosure, the shift register unit comprises two stages of shift register sub-units.

That is, the shift register unit comprises a shift register sub-unit 201 (referred to as "one stage of shift register sub-unit" hereinafter) and a shift register sub-unit 202 (referred to as "the other stage of shift register sub-unit" hereinafter). The shift register sub-unit 201 has a pull-up node Q1 and a pull-down node QB1, the shift register sub-unit 202 has a pull-up node Q2 and a pull-down node QB2. Accordingly, the control sub-units comprises two sets of nodes, one set of nodes comprises a first control node Q1' and a second control node QB1'; and the other set of nodes comprises a first control node Q2' and a second control node QB2'.

In order to not affect the signal output of the respective shift register sub-units in the shift register unit, optionally, each of the shift register sub-units comprises a transfer module, an output module and a transfer output terminal.

The transfer module comprises a transfer pull-up transistor and a transfer pull-down transistor, the transfer pull-up transistor has a gate connected to the pull-up node, a first electrode connected to a clock signal input terminal, and a second electrode connected to a first electrode of the transfer pull-down transistor, the transfer pull-down transistor has a gate connected to the pull-down node and a second electrode connected to the low level input terminal, and the transfer output terminal is connected between the second electrode of the transfer pull-up transistor and the first electrode of the transfer pull-down transistor.

The output module comprises an output pull-up transistor and an output pull-down transistor, the output pull-up transistor has a gate connected to the pull-up node, a first electrode connected to the clock signal input terminal, and a second electrode connected to a first electrode of the output pull-down transistor, the output pull-down transistor has a gate connected to the pull-down node and a second electrode connected to the low level input terminal, and the main output terminal is connected between the second electrode of the output pull-up transistor and the first electrode of the output pull-down transistor.

The output module is only used to provide signal to the main output terminal, the transfer module is used to provide a start signal to a next stage of shift register sub-unit and a reset signal to a previous stage of shift register sub-unit and a reset signal to a previous stage of shift register sub-unit via the transfer output terminal. The control sub-unit can achieve control on the output module and the transfer module.

In the embodiments of the present disclosure, no specific requirement is made on specific configuration of the control sub-unit 100 only if it can be ensured that, when one shift register sub-unit outputs a set of pulse signals, the pull-down nodes of the other shift register sub-units are pulled down. As a specific implementation of the embodiments of the present disclosure, when the shift register unit comprises two stages of shift register sub-units, as shown in FIG. 2, the control sub-unit comprises a first thin film transistor M1_2, a second thin film transistor M2_2, a third thin film transistor M3 and a fourth thin film transistor M4. It can be seen from FIG. 1 and FIG. 2, the gate of the first thin film transistor M1_2 is connected to the pull-up node Q1 of one stage of shift register sub-unit in the two stages of shift register sub-units, the first electrode of the first thin film transistor M1_2 is connected to the pull-up node Q2 of the other stage of shift register sub-unit in the two stages of shift register sub-units, and the second electrode of the first thin film transistor M1_2 is connected to the low level input terminal VGL; the gate of the second thin film transistor M2_2 is connected to the pull-up node Q2 of the other stage of shift register sub-unit in the two stages of shift register sub-units, the first electrode of the second thin film transistor M2_2 is connected to the pull-up node Q1 of said one stage of shift register sub-unit in the two stages of shift register sub-units, and the second electrode of the second thin film transistor M2_2 is connected to the low level input terminal VGL; the gate of the third thin film transistor M3 is connected to the gate of the first thin film transistor M1_2, the first electrode of the third thin film transistor M3 is connected to the first second electrode of the first thin film transistor M1_2, the second electrode of the third thin film transistor M3 is connected to the pull-down node QB2 of the other stage of shift register sub-unit in the two stages of shift register sub-units; the gate of the fourth thin film transistor M4 is connected to the gate of the second thin film transistor M2_2, the first electrode of the fourth thin film transistor M4 is connected to the second electrode of the first thin film transistor M2_2, the second electrode of the fourth thin film transistor M4 is connected to the pull-down node QB1 of said one stage of shift register sub-unit in the two stages of shift register sub-units.

The operational principle of such control sub-unit will be introduced hereinafter. When said one stage of shift register sub-unit is in an output phase, its pull-up node Q1 is at a high level and its pull-down node QB1 is at a low level, and the pull-up node Q2 of the other stage of shift register sub-unit is at a low level and the pull-down node QB2 of the other stage of shift register sub-unit is at a high level, therefore the first thin film transistor M1_2 and the third thin film transistor M3 are turned on, and the second thin film transistor M2_2 and the fourth thin film transistor M4 are turned off. Therefore, the pull-down node QB2 of the other stage of shift register sub-unit is connected to the low level input terminal VGL, and is pulled down to the low level VGL by aid of the low level input terminal VGL. At this time, the pull-up node Q2 and the pull-down node QB2 of the other stage of shift register sub-unit are both at a low level, the other stage of shift register sub-unit outputs a high impedance state and said one stage of shift register sub-unit outputs a high level signal to the main output terminal.

Similarly, when the other stage of shift register sub-unit is in an output phase, its pull-up node Q2 is at a high level and its pull-down node QB2 is at a low level, and the pull-up node Q1 of said one stage of shift register sub-unit is at a low level and the pull-down node QB1 of said one stage of shift register sub-unit is at a high level, therefore the second thin film transistor M2_2 and the fourth thin film transistor M4 are turned on, and the first thin film transistor M1_2 and the third thin film transistor M3 are turned off. Therefore, the pull-down node QB1 of said one stage of shift register sub-unit is connected to the low level input terminal VGL, and is pulled down to the low level VGL by aid of the low level input terminal VGL. At this time, the pull-up node Q1 and the pull-down node QB1 of said one stage of shift register sub-unit are both at a low level, said one stage of shift register sub-unit outputs a high impedance state and the other stage of shift register sub-unit outputs a high level signal to the main output terminal.

As a specific implementation of the control sub-unit 100, in order to ensure the thin film transistor being turned off, optionally, as shown in FIG. 3, the control sub-unit further comprises the first feedback suppression thin film transistor M1_1 and the second feedback suppression thin film transistor M2_1. Under this circumstance, each set of nodes in the control sub-unit comprises a first feedback node. For example, in the implementation as shown in FIG. 3, one set of nodes of the control sub-unit comprises a first feedback node OFF_1' and the other set of nodes of the control sub-unit comprises a first feedback node OFF_2', the specific configuration of the first feedback suppression thin film transistor M1_1 and the second feedback suppression thin film transistor M2_1 have been described above, and repeated descriptions are omitted herein. Accordingly, each of the shift register sub-units shall comprises a second feedback node, and the first feedback node is connected to the second feedback node of its corresponding shift register sub-unit.

It should be noted that when the pull-up node Q1 of said one stage of shift register sub-unit in the two stages of shift register sub-units is at a high level, the second feedback node of said one stage of shift register sub-unit is also at a high level; when the pull-up node Q2 of the other stage of shift register sub-unit in the two stages of shift register sub-units is at a high level, the second feedback node of the other stage of shift register sub-unit is also at a high level.

With arrangement of the first feedback suppression thin film transistor M1_1 and the second feedback suppression thin film transistor M2_1, it can be ensured that the second thin film transistor M2_2 is turned off when said one stage of shift register unit is in an output phase and the first thin film transistor M2_1 is turned off when the other stage of shift register unit is in an output phase.

For example, when said one stage of shift register sub-unit is in an output phase, the pull-up node Q1 is at a high level and the pull-down node QB1 is at a low level, the second feedback node of said one stage of shift register sub-unit is at a high level, such that the first feedback node OFF_1' connected to the second feedback node is also at a high level, therefore the first thin film transistor M1_2 and the third thin film transistor M3 are turned on, and the second thin film transistor M2_2 and the fourth thin film transistor M4 are totally turned off (it can be ensured that the second thin film transistor M2_2 and the fourth thin film transistor M4 are totally turned off since the first feedback node OFF_1' in said one set of nodes of the control sub-unit is at a high level which is obviously higher than a low level at the first control node Q2' in the other set of nodes of the control sub-unit). Therefore, the pull-down node QB2 of the other stage of shift register sub-unit is connected to the low level input terminal VGL, and is pulled down to the low level VGL by aid of the low level input terminal VGL. At this time, the pull-up node Q2 and the pull-down node QB2 of the other stage of shift register sub-unit are both at a low level, the other stage of shift register sub-unit outputs a high impedance state and said one stage of shift register sub-unit outputs a high level signal to the main output terminal.

Similarly, when the other stage of shift register sub-unit is in an output phase, its pull-up node Q2 is at a high level and its pull-down node QB2 is at a low level, and the pull-up node Q1 of said one stage of shift register sub-unit is at a low level and the pull-down node QB1 of said one stage of shift register sub-unit is at a high level, therefore the second thin film transistor M2_2 and the fourth thin film transistor M4 are turned on, and the first thin film transistor M1_2 and the third thin film transistor M3 are totally turned off (it can be ensured that the first thin film transistor M1_2 and the third thin film transistor M3 are totally turned off since the first feedback node OFF_2' in the other set of nodes of the control sub-unit is at a high level which is obviously higher than a low level at the first control node Q1' in said one set of nodes of the control sub-unit). Therefore, the pull-down node QB1 of said one stage of shift register sub-unit is connected to the low level input terminal VGL, and is pulled down to the low level VGL by aid of the low level input terminal VGL. At this time, the pull-up node Q1 and the pull-down node QB1 of said one stage of shift register sub-unit are both at a low level, said one stage of shift register sub-unit outputs a high impedance state and the other stage of shift register sub-unit outputs a high level signal to the main output terminal.

In the embodiments of the present disclosure, no specific limitation is made on the specific location of the second feedback node of said one stage of shift register sub-unit and the second feedback node of the other stage of shift register sub-unit, only if following conditions can be met: when the pull-up node Q1 of said one stage of shift register sub-unit in the two stages of shift register sub-units is at a high level, the second feedback node of said one stage of shift register sub-unit is also at a high level; when the pull-up node Q1 of said one stage of shift register sub-unit in the two stages of shift register sub-units is at a low level, the second feedback node of said one stage of shift register sub-unit is also at a low level; when the pull-up node Q2 of the other stage of shift register sub-unit in the two stages of shift register sub-units is at a high level, the second feedback node of the other stage of shift register sub-unit is also at a high level; when the pull-up node Q2 of the other stage of shift register sub-unit in the two stages of shift register sub-units is at a low level, the second feedback node of the other stage of shift register sub-unit is also at a low level.

As a preferable implementation of the embodiments of the present disclosure, each of the shift register sub-units further comprises a feedback module, the feedback module comprises a feedback pull-up transistor, a feedback pull-down transistor and a feedback output transistor, the feedback pull-up transistor has a gate connected to the pull-up node, a first electrode connected to a clock signal input terminal, and a second electrode connected to a first electrode of the feedback pull-down transistor, the feedback pull-down transistor has a gate connected to the pull-down node and a second electrode connected to the low level input terminal, the feedback output transistor has a gate connected to the transfer output terminal, a first electrode connected to the second feedback node and a second electrode connected between the second electrode of the feedback pull-up transistor and the first electrode of the feedback pull-down transistor.

Figure 5:
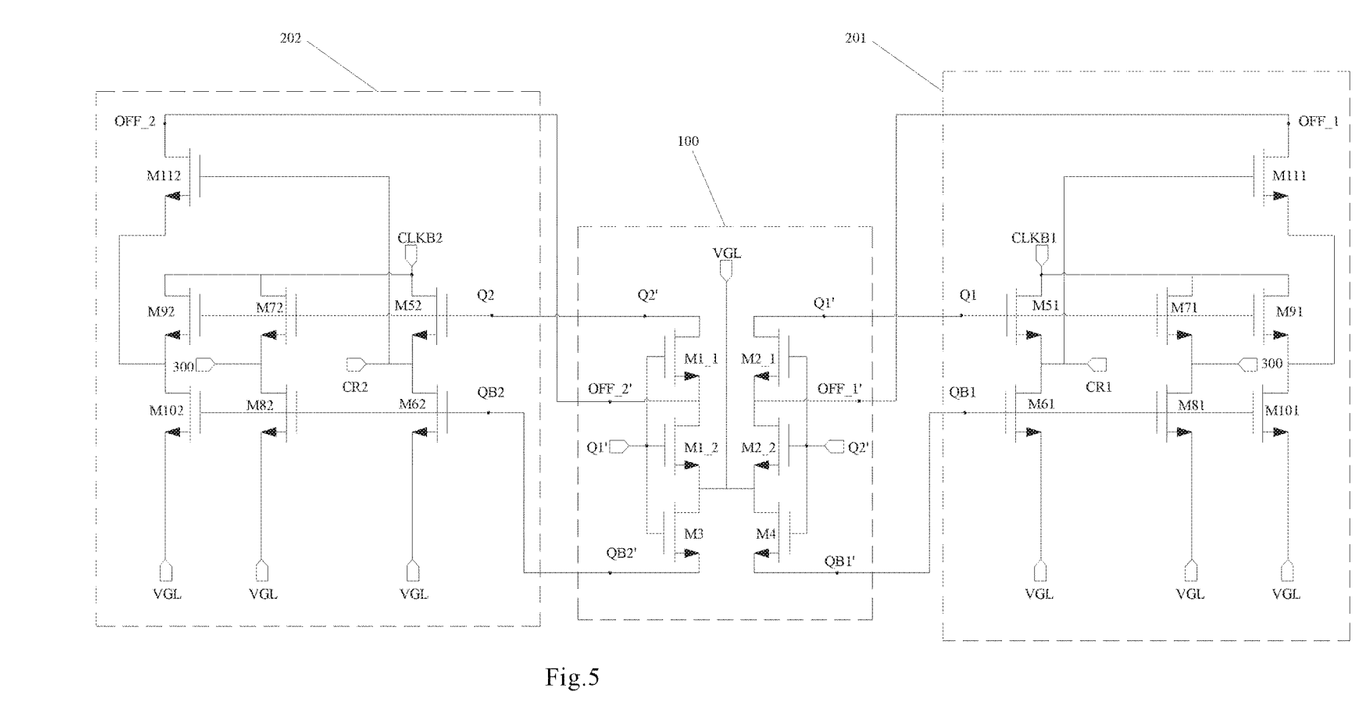
FIG. 5 is a schematic diagram of a part of the shift register unit provided in the embodiments of the present disclosure.

Part of a specific implementation of the shift register unit as provided in the embodiments of the present disclosure is shown in FIG. 5. As shown in FIG. 5, the shift register unit comprises a shift register sub-unit 201, a shift register sub-unit 202 and a control sub-unit 100 connected between the shift register sub-unit 201 and the shift register sub-unit 202. It should be noted that only a part of the shift register sub-unit 201 and a part of the shift register sub-unit 202 are shown in FIG. 5.

The shift register sub-unit 201 has the transfer output terminal CR1. The transfer module of the shift register sub-unit 201 comprises a transfer pull-up transistor M51 and a transfer pull-down transistor M61, the transfer pull-up transistor M51 has a gate connected to the pull-up node Q1, a first electrode connected to a clock signal input terminal CLKB1, and a second electrode connected to a first electrode of the transfer pull-down transistor M61, the transfer pull-down transistor M61 has a gate connected to the pull-down node QB1 and a second electrode connected to the low level input terminal VGL.

The output module of the shift register sub-unit 201 comprises an output pull-up transistor M71 and an output pull-down transistor M81, the output pull-up transistor M71 has a gate connected to the pull-up node Q1, a first electrode connected to the clock signal input terminal CLKB1 and a second electrode connected to a first electrode of the output pull-down transistor M81, the output pull-down transistor M81 has a gate connected to the pull-down node QB1 and a second electrode connected to the low level input terminal VGL, and the main output terminal 300 is connected between the second electrode of the output pull-up transistor M71 and the first electrode of the output pull-down transistor M81.

The feedback module of the shift register sub-unit 201 comprises a feedback pull-up transistor M91, a feedback pull-down transistor M101 and a feedback output transistor M111. The feedback pull-up transistor M91 has a gate connected to the pull-up node Q1, a first electrode connected to the clock signal input terminal CLKB1 and a second electrode connected to a first electrode of the feedback pull-down transistor M101, the feedback pull-down transistor M101 has a gate connected to the pull-down node QB1 and a second electrode connected to the low level input terminal VGL. The feedback output transistor M111 has a gate connected to the transfer output terminal CR1, a first electrode connected to the second feedback node OFF_1 and a second electrode connected between the second electrode of the feedback pull-up transistor M91 and the first electrode of the feedback pull-down transistor M92.

When the pull-up node Q1 is at a high level and the pull-down node QB1 is at a low level, the shift register sub-unit 201 outputs a high level to the main output terminal 300, and the transfer output terminal CR1 outputs a high level, such that the feedback output transistor M111 is turned on and the drain of the feedback output transistor M111 is at a high level (that is, the first electrode of the feedback output transistor M111 is at the high level of the clock signal input terminal CLKB1), and thus the second feedback node OFF_1 is at a high level.

The shift register sub-unit 202 has the transfer output terminal CR2. The transfer module of the shift register sub-unit 202 comprises a transfer pull-up transistor M52 and a transfer pull-down transistor M62, the transfer pull-up transistor M52 has a gate connected to the pull-up node Q2, a first electrode connected to a clock signal input terminal CLKB2 and a second electrode connected to a first electrode of the transfer pull-down transistor M62, the transfer pull-down transistor M62 has a gate connected to the pull-down node QB2 and a second electrode connected to the low level input terminal VGL.

The output module of the shift register sub-unit 202 comprises an output pull-up transistor M72 and an output pull-down transistor M82, the output pull-up transistor M72 has a gate connected to the pull-up node Q2, a first electrode connected to the clock signal input terminal CLKB2 and a second electrode connected to a first electrode of the output pull-down transistor M82, the output pull-down transistor M82 has a gate connected to the pull-down node QB2 and a second electrode connected to the low level input terminal VGL, and the main output terminal 300 is connected between the second electrode of the output pull-up transistor M72 and the first electrode of the output pull-down transistor M82.

The feedback module of the shift register sub-unit 202 comprises a feedback pull-up transistor M92, a feedback pull-down transistor M102 and a feedback output transistor M112. The feedback pull-up transistor M92 has a gate connected to the pull-up node Q2, a first electrode connected to the clock signal input terminal CLKB2 and a second electrode connected to a first electrode of the feedback pull-down transistor M102, the feedback pull-down transistor M102 has a gate connected to the pull-down node QB2 and a second electrode connected to the low level input terminal VGL. The feedback output transistor M112 has a gate connected to the transfer output terminal CR2, a first electrode connected to the second feedback node OFF_2 and a second electrode connected between the second electrode of the feedback pull-up transistor M92 and the first electrode of the feedback pull-down transistor M102.

When the pull-up node Q2 is at a high level and the pull-down node QB2 is at a low level, the shift register sub-unit 202 outputs a high level to the main output terminal 300, and the transfer output terminal CR2 outputs a high level, such that the feedback output transistor M112 is turned on and the drain of the feedback output transistor M112 is at a high level (that is, the first electrode of the feedback output transistor M111 is at the high level of the clock signal input terminal CLKB2), and thus the second feedback node OFF_2 is at a high level.

As another aspect of the embodiments of the present disclosure, there is provided a shift register comprising a plurality of shift register units connected in cascade, wherein the shift register unit is the above shift register unit as provided in the present disclosure. In two adjacent stages of shift register units, the plurality of shift register sub-units in a first stage of the two adjacent stages of shift register units are connected in cascade with the plurality of shift register sub-units in a second stage of the two adjacent stages of shift register units in one-to-one correspondence.

It can be seen from the above description that said one single output terminal of the shift register can output a plurality of different pulse signals without addition of number of leading wires, such that design of a narrow bezel of a display panel can be achieved.

When each of shift register sub-units in the shift register unit comprises a transfer module, the transfer output terminal of the first stage of shift register sub-unit is connected to the input terminal of the second stage of shift register sub-unit, and an effect on the output signal can be avoided by aid of transferring signal via the transfer module.

According to another aspect of the present disclosure, there is further provided a gate driving circuit comprising the above shift register as provided in the present disclosure.

According to another aspect of the present disclosure, there is further provided a display apparatus comprising the above gate driving circuit as provided in the present disclosure.

Since the gate driving circuit is the above gate driving circuit as provided in the embodiments of the present disclosure, the display apparatus can achieve a narrow bezel. In the embodiments of the present disclosure, the display apparatus can be a television, a computer display screen, a cell phone, a tablet, and a navigator etc. The display apparatus can be a liquid crystal display apparatus, and can also be an organic light emitting diode OLED display apparatus.

When the display apparatus is a liquid display apparatus, the gate driving circuit outputs a plurality of different pulse signals for each of gate lines, such that liquid crystal capacitors in the liquid display apparatus can be fully charged in divisional. When the display apparatus is an OLED display apparatus, the gate driving circuit outputs a plurality of different pulse signals for each of gate lines, such that each of pixel circuits in the OLED display apparatus can operate in different phases (for example, pre-charging phase, compensating phase and light emitting phase).

It should be understood that the above implementations are only exemplary implementations for illustration of principle of the embodiments of the present disclosure, and the embodiments of the present disclosure are not limited thereto. For those skilled in the art, various variations and improvements can be made without departing from the spirit and scope of the embodiments of the present disclosure, which should be considered as falling within the protection scope of the embodiments of the present disclosure.

This application claims priority to a Chinese Patent Application No. 201510148924.0, filed on Mar. 31, 2015 in the China's State Intellectual Property Office, the disclosure of which is incorporated by reference herein as a whole.

What is claimed is:

1. A control sub-unit comprising: a low level input terminal, a selection module and N sets of nodes,
   each set of nodes comprises a first control node and a second control node, when the first control node in one set of nodes among the N sets of nodes is at a high level and the second control node in said one set of nodes is at a low level, the selection module connects the second control nodes of the other N−1 sets of nodes to the low level input terminal, such that the first control nodes and the second control nodes in the other N−1 sets of nodes are all at the low level, wherein N is a positive integer larger than 1.

2. The control sub-unit of claim 1, wherein N is 2.

3. The control sub-unit of claim 2, wherein the selection module comprises:
a first thin film transistor having a gate connected to the first control node in said one set of nodes, a first electrode connected to the first control node in the other set of nodes, and a second electrode connected to the low level input terminal;
a second thin film transistor having a gate connected to the first control node in the other set of nodes, a first electrode connected to the first control node in said one set of nodes, and a second electrode connected to the low level input terminal;
a third thin film transistor having a gate connected to the first control node in said one set of nodes, a first electrode connected to the low level input terminal, and a second electrode connected to the second control node in the other set of nodes; and
a fourth thin film transistor having a gate connected to the first control node in the other set of nodes, a first electrode connected to the low level input terminal, and a second electrode connected to the second control node in said one set of nodes.

4. The control sub-unit of claim 3, wherein each set of nodes comprises a first feedback node, and the selection module further comprises:
a first feedback suppression thin film transistor having a gate connected to the first control node in said one set of nodes, a first electrode connected to the first control node in the other set of nodes, and a second electrode connected to the first feedback node in the other set of nodes; and
a second feedback suppression thin film transistor having a gate connected to the first control node in the other set of nodes, a first electrode connected to the first control node in said one set of nodes, and a second electrode connected to the first feedback node in said one set of nodes,
wherein the first electrode of the first thin film transistor is connected to the first feedback node in the other set of nodes, and the first electrode of the second thin film transistor is connected to the first feedback node in said one set of nodes.

5. A shift register unit having a main output terminal and comprising a control sub-unit of claim 1 and N shift register sub-units capable of outputting signals with predefined waveforms during different time periods, wherein
said N sets of nodes of the control sub-unit are corresponding to said N shift register sub-units one by one,
wherein for any one set of nodes, the first control node of said one set of nodes is connected to a pull-up node of the shift register sub-unit corresponding to said one set of nodes, the second control node of said one set of nodes is connected to a pull-down node of the shift register sub-unit corresponding to said one set of nodes, such that, during an output phase of any one of said N shift register sub-units, the control sub-unit connects the pull-up nodes of other shift register sub-units to the low level input terminal so as to make said other shift register sub-units output a high impedance state.

6. The shift register unit of claim 5, wherein each of said shift register sub-units comprises a transfer module, an output module and a transfer output terminal,
the transfer module comprises a transfer pull-up transistor and a transfer pull-down transistor, the transfer pull-up transistor has a gate connected to the pull-up node, a first electrode connected to a clock signal input terminal and a second electrode connected to a first electrode of the transfer pull-down transistor, the transfer pull-down transistor has a gate connected to the pull-down node and a second electrode connected to the low level input terminal, and the transfer output terminal is connected between the second electrode of the transfer pull-up transistor and the first electrode of the transfer pull-down transistor;
the output module comprises an output pull-up transistor and an output pull-down transistor, the output pull-up transistor has a gate connected to the pull-up node, a first electrode connected to the clock signal input terminal and a second electrode connected to a first electrode of the output pull-down transistor, the output pull-down transistor has a gate connected to the pull-down node and a second electrode connected to the low level input terminal, and the main output terminal is connected between the second electrode of the output pull-up transistor and the first electrode of the output pull-down transistor.

7. The shift register unit of claim 6, wherein in the control sub-unit, each set of nodes comprises a first feedback node, and the selection module further comprises:
a first feedback suppression thin film transistor having a gate connected to the first control node in said one set of nodes, a first electrode connected to the first control node in the other set of nodes and a second electrode connected to the first feedback node in the other set of nodes; and
a second feedback suppression thin film transistor having a gate connected to the first control node in the other set of nodes, a first electrode connected to the first control node in said one set of nodes, and a second electrode connected to the first feedback node in said one set of nodes,
wherein the first electrode of the first thin film transistor is connected to the first feedback node in the other set of nodes, and the first electrode of the second thin film transistor is connected to the first feedback node in said one set of nodes;
each of said shift register sub-units comprises a second feedback node;
the first feedback node is connected to the second feedback node of the shift register sub-unit corresponding thereto, wherein
when the pull-up node of one stage of two stages of shift register sub-units is at a high level, the second feedback node of said one stage of shift register sub-unit is also at a high level;
when the pull-up node of the other stage of said two stages of shift register sub-units is at a high level, the second feedback node of the other stage of shift register sub-unit is also at a high level.

8. The shift register unit of claim 7, wherein each of said shift register sub-units comprises a feedback module, the feedback module comprises a feedback pull-up transistor, a feedback pull-down transistor and a feedback output transistor, the feedback pull-up transistor has a gate connected to the pull-up node, a first electrode connected to the clock signal input terminal and a second electrode connected to a first electrode of the feedback pull-down transistor, the transfer pull-down transistor has a gate connected to the pull-down node and a second electrode connected to the low level input terminal, the feedback output transistor has a gate connected to the transfer output terminal, a first electrode connected to the second feedback node and a second electrode connected between the second electrode of the feedback pull-up transistor and the first electrode of the feedback pull-down transistor.

9. A shift register comprising a plurality of shift register units of claim 5 connected in cascade, wherein in two adjacent stages of shift register units, the plurality of shift register sub-units in a first stage of the two adjacent stages of shift register units are connected in cascade with the plurality of shift register sub-units in a second stage of the two adjacent stages of shift register units in one-to-one correspondence.

10. The shift register unit of claim 5, wherein the selection module comprises:
a first thin film transistor having a gate connected to the first control node in said one set of nodes, a first electrode connected to the first control node in the other set of nodes, and a second electrode connected to the low level input terminal;
a second thin film transistor having a gate connected to the first control node in the other set of nodes, a first electrode connected to the first control node in said one set of nodes, and a second electrode connected to the low level input terminal;
a third thin film transistor having a gate connected to the first control node in said one set of nodes, a first electrode connected to the low level input terminal, and a second electrode connected to the second control node in the other set of nodes; and
a fourth thin film transistor having a gate connected to the first control node in the other set of nodes, a first electrode connected to the low level input terminal, and a second electrode connected to the second control node in said one set of nodes.

11. The shift register unit of claim 10, wherein each set of nodes comprises a first feedback node, and the selection module further comprises:
a first feedback suppression thin film transistor having a gate connected to the first control node in said one set of nodes, a first electrode connected to the first control node in the other set of nodes, and a second electrode connected to the first feedback node in the other set of nodes; and
a second feedback suppression thin film transistor having a gate connected to the first control node in the other set of nodes, a first electrode connected to the first control node in said one set of nodes, and a second electrode connected to the first feedback node in said one set of nodes,
wherein the first electrode of the first thin film transistor is connected to the first feedback node in the other set of nodes, and the first electrode of the second thin film transistor is connected to the first feedback node in said one set of nodes.

* * * * *